United States Patent [19]

Polasko et al.

[11] Patent Number: 4,982,246
[45] Date of Patent: Jan. 1, 1991

[54] SCHOTTKY PHOTODIODE WITH SILICIDE LAYER

[75] Inventors: Kenneth J. Polasko, Latham; Ivan L. Wemple, Schenectady, both of N.Y.

[73] Assignee: General Electric Company, Schenectady, N.Y.

[21] Appl. No.: 369,405

[22] Filed: Jun. 21, 1989

[51] Int. Cl.$^5$ .......................................... H01L 29/48
[52] U.S. Cl. ...................................... 357/15; 357/30; 357/67; 357/58; 357/32
[58] Field of Search ..................... 357/15, 30 C, 30 K, 357/30 H, 58, 2, 32, 31, 67 S, 68

[56] References Cited

U.S. PATENT DOCUMENTS

| 4,163,677 | 8/1979 | Carlson et al. | 357/30 C X |
| 4,532,373 | 7/1985 | Matsuura et al. | 357/30 K X |
| 4,543,442 | 9/1985 | Alcorn et al. | 357/30 C X |

FOREIGN PATENT DOCUMENTS 60-4274  1/1985  Japan ............................... 357/30 K

OTHER PUBLICATIONS

Li, "A Proposed Novel MPN GaAs Schottky Barrier Solar Cell", *Japanese Journal of Applied Physics*, vol. 17 (1978), Supplement 17-1, pp. 291-294.
Wu et al., "Nb/GaAs and NbN/GaAs Schottky Barriers", *Appl. Phys. Lett.,* 50(5), Feb. 2, 1987, pp. 287-289.
Murarka, "Refractory Silicides for Integrated Circuits", *J. Vac. Sci. Technol.,* 17(4), Jul./Aug. 1980, pp. 775-791.

*Primary Examiner*—William Mintel
*Attorney, Agent, or Firm*—Marvin Snyder; James C. Davis, Jr.

[57] ABSTRACT

A Schottky photodiode formed by the method including the steps of: forming a base electrode on the principal substrate surface; depositing a layer of N+ amorphous silicon on the base electrode; depositing a layer of intrinsic silicon on the N+ amorphous silicon layer; depositing a Schottky contact on the intrinsic silicon layer; and selectively patterning the Schottky contact and the two silicon layers with the same photoresist mask to form a Schottky photodiode island.

8 Claims, 4 Drawing Sheets

SCHOTTKY PHOTODIODE WITH SILICIDE LAYER

BACKGROUND OF THE INVENTION

The present invention relates to photodiodes and, more particularly, to a novel method for fabricating Schottky photodiodes.

Schottky photodiodes have received extensive use in imaging applications, particularly imaging for medical purposes such as infrared imaging, ultraviolet imaging, x-ray imaging and the like. Basically, light energy or similar electromagnetic energy, incident upon a photodiode, or an array of photodiodes, will create an electrical signal, or signals, which can be processed to produce an image which can be displayed by means of a cathode ray tube or the like.

Conventional Schottky photodiodes are fabricated by depositing a base or bottom electrode on a principal substrate surface. A layer of doped amorphous silicon (a-Si) follows. A layer of intrinsic silicon (i-Si) is formed on the a-Si layer and a first layer of passivation material such as silicon nitride (SiN) or the like is formed over the i-Si layer. This multilayer "sandwich" is then patterned and etched with a first mask by known photolithographic techniques to form a diode island. A second layer of passivation material, such as SiN, is deposited over the diode island; both passivation layers are then patterned and etched with a second mask to form a via opening which exposes a portion of the i-Si layer top surface. A top electrode, or Schottky contact, is disposed on the second passivation layer and on the exposed i-Si layer portion through the via opening. That area where the Schottky material electrically contacts the exposed i-Si portion is referred to as the active area. Problems can arise with this fabrication method because of pattern transfer errors between the photoresist mask and the second passivation layer in the second masking operation, which can cause the via opening to be misaligned with the diode island. If the via opening is misaligned to the extent that it extends beyond the edge of the i-Si layer top surface and also exposes the underlying doped a-Si layer or the base electrode, the subsequently deposited Schottky contact metallization will short-circuit the diode and the device will not function. To minimize misalignment errors and etching errors, the via opening formed in the second mask operation is made smaller than the top surface of the diode island; however, this reduces the size of the active area of the photodiode and adversely affects some photodiode performance characteristics, such as reduced signal-to-noise operation. The reduction of active area is not very significant with larger photodiodes, but when high packing density design constraints require small photodiodes, the loss of active area becomes more critical. Additionally, current methods of fabricating Schottky photodiodes typically employ at least two critical masking and etching steps; besides reducing the photodiode's active area as explained above, the multiple masking steps also reduce throughput and yield.

It is accordingly a primary object of the present invention to provide a novel method for fabricating Schottky photodiodes which is not subject to the foregoing disadvantages.

It is another object of the present invention to provide a novel method for fabricating novel Schottky photodiodes which maximizes the active area of such diodes.

It is a further object of the present invention to provide a novel method for fabricating Schottky photodiodes which requires a minimum number of masking steps.

These and other objects of the invention, together with features and advantages thereof, will become apparent from the following detailed specification when read with the accompanying drawings in which like references numerals refer to like elements.

SUMMARY OF THE INVENTION

In accordance with the invention, a method for use in fabricating Schottky photodiodes includes the steps of: depositing a first metal layer on a principal substrate surface to form a bottom, or base, contact; forming a layer of doped amorphous silicon disposed on the first metal layer; forming a layer of intrinsic silicon on the doped amorphous silicon layer; depositing a second metal layer over the intrinsic silicon layer to form a Schottky contact in electrical contact with substantially all of the intrinsic silicon layer; and selectively patterning the Schottky contact and the silicon layers with the same mask to form a diode island. A layer of passivation material is deposited over the diode island to provide electrical isolation from adjacent Schottky photodiodes or the like and is patterned to form a via opening exposing a portion of the Schottky contact. A layer of transparent conductive material is then deposited on the passivation layer and through the via opening in electrical contact with the Schottky contact to electrically interconnect the Schottky photodiode to other photodiodes or the like.

DETAILED DESCRIPTION OF THE PREFERRED EMBODIMENT

Figure 1A:
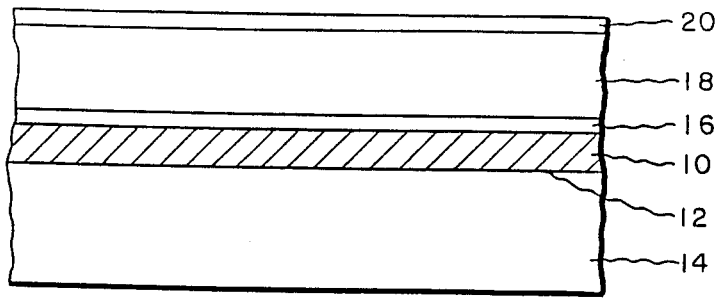
FIGS. 1A-1E are cross-sectional, side elevation views of the steps employed in a conventional Schottky photodiode fabrication method.
Figure 1B:
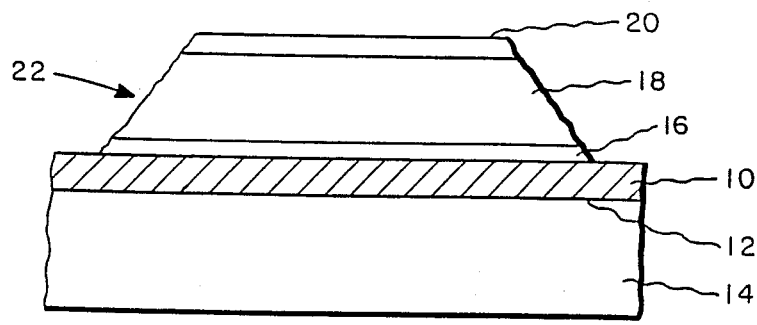
Figure 1C:
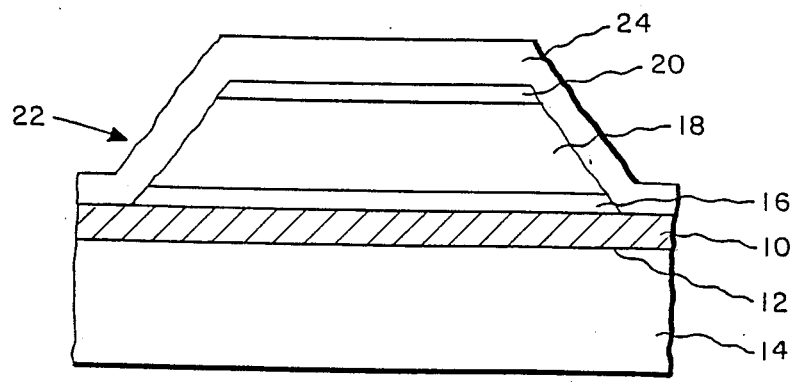
Figure 1D:
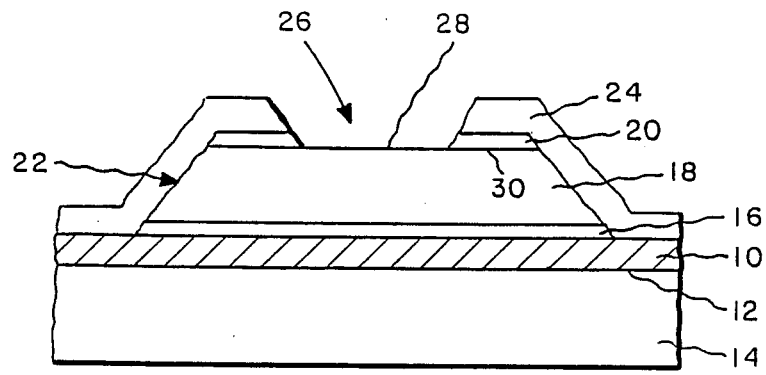
Figure 1E:
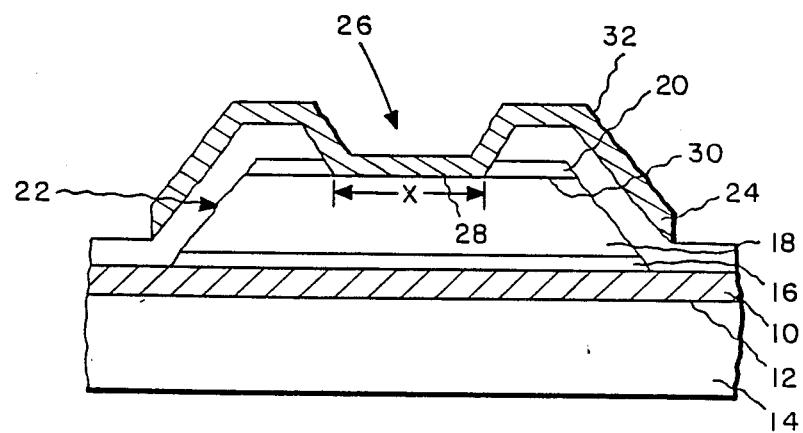

Referring to FIG. 1A, in a conventional method for fabricating a Schottky photodiode, a first layer 10 of metallization is deposited on a principal surface 12 of a substrate 14 to form a bottom or base electrode. A layer 16 of amorphous silicon (a-Si) is deposited by chemical vapor deposition (CVD) or by plasma enhanced chemical vapor deposition (PECVD) and is doped to preferably have N+conductivity. A layer 18 of intrinsic silicon (i-Si) is deposited on N+ layer 16 and a first layer 20 of passivation material, usually silicon nitride (SiN), is deposited over i-Si layer 18. At this stage in currently practiced Schottky photodiode fabrication methods, the silicon sandwich formed by layers 16, 18 and 20 is patterned and etched, in a first masking step, using known photolithographic techniques, to form a diode island 22 (FIG. 1B). A second layer 24 of passivation material, usually SiN, is formed over the diode island 22 as shown in FIG. 1C. A second masking operation is performed and the second and first passivation layers 20 and 24 are patterned and etched to form an aperture 26 therein (FIG. 1D) through which a portion 28 of the top surface 30 of i-Si layer 18 is exposed. Referring to FIG. 1E, another layer 32 of metallization is deposited, as by sputtering or evaporation, on passivation layer 24 and on exposed i-Si portion 28 through aperture 26, to form a Schottky contact to i-Si layer 18. Aperture 26 is made smaller than top surface 30 of i-Si layer 18 to minimize masking misalignment errors and etching errors when aperture 26 is formed to expose i-Si portion 28 on diode island 22, but the small aperture has the disadvantage of reducing the active area, defined by dimension "X" in FIG. 1E, which is the area where Schottky contact 32 makes electrical contact with i-Si layer 18.

Figure 2A:
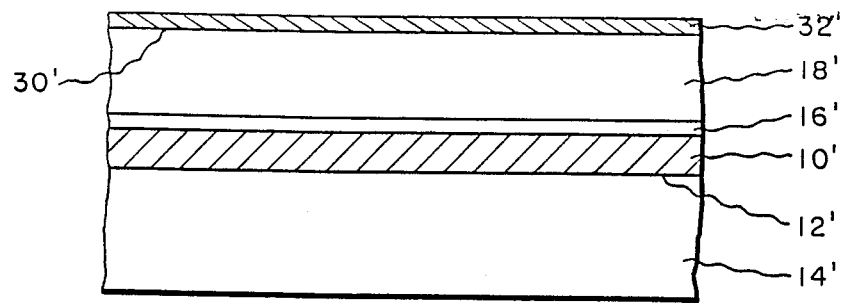
FIGS. 2A-2E are cross-sectional, side elevation views of the steps employed in the Schottky photodiode fabrication method in accordance with the present invention.

In accordance with the present invention, referring to FIG. 2A, a layer 10' of conductive material is deposited on substrate surface 12'. Layer 10' may be any metal, such as chromium, titanium, tungsten, aluminum or alloys thereof, but is preferably molybdenum deposited by sputtering or evaporation to a thickness of about 4000 angstroms. A layer 16' of amorphous silicon (a-Si) is deposited to a thickness of . about 500 angstroms on conductive layer 10' by CVD or PECVD and layer 16' is doped to preferably have N+ type conductivity. A layer 18' of intrinsic silicon (i-Si) is deposited by CVD or PECVD to a thickness of between about 5,000 and 20,000 angstroms on N+ layer 16' and a Schottky contact layer 32' is deposited on i-Si layer 18'. Schottky contact layer 32' may be any metal which can form a silicide, such as palladium, and may be deposited to a thickness between 50 and 100 angstroms.

Figure 2B:
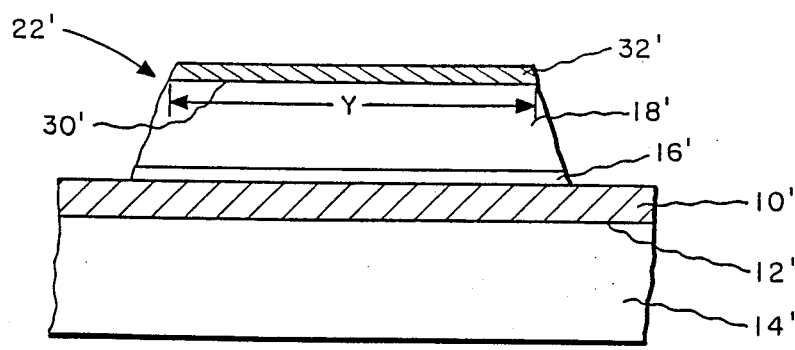

Schottky contact layer 32', i-Si layer 18' and N+ layer 16' are patterned and etched by known photolithographic techniques to form diode island 22' (FIG. 2B). The active area defined by dimension "Y" in FIG. 2B is that area where Schottky contact 32' is in electrical contact with i-Si layer top surface 30'. By comparing dimension Y (FIG. 2B) with dimension X (FIG. 1E), it is apparent that the active area (Y) of the present invention is substantially the entire top surface 30' of i-Si layer 18' and is not reduced in size like the prior art active area (X). The unreduced active area results because Schottky contact layer 32' is deposited before diode island 22' is formed; therefore, only a single masking step is required to form the photodiode and misalignment and etching problems between the Schottky contact 32' and diode island 22' are eliminated.

Figure 2C:
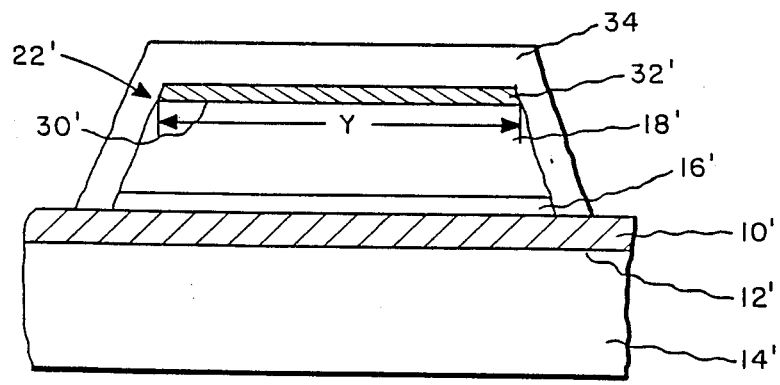
Figure 2D:
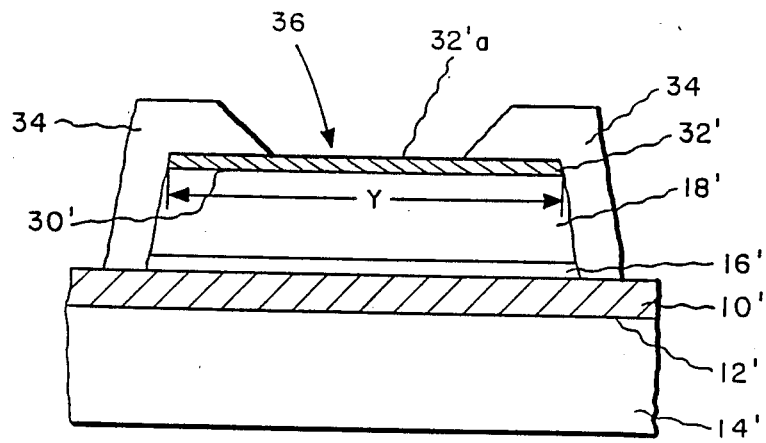
Figure 2E:
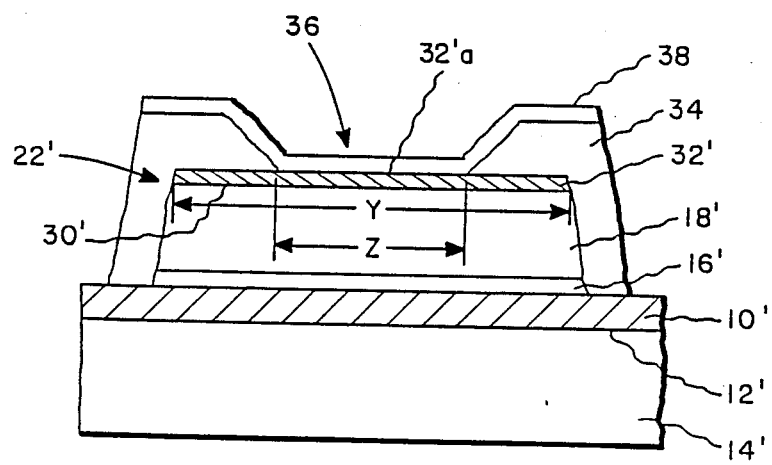

Referring now to FIG. 2C, a layer 34 of a light transmissive passivation material, such as SiN and the like, is deposited over diode island 22' to provide electrical isolation from adjacent photodiodes or other circuit components (not shown). Passivation layer 34 may be deposited to a thickness of about 2000 angstroms or to a thickness sufficient to ensure adequate step coverage over the photodiode island. Passivation layer 34 is then patterned and etched by standard photolithography to form a contact opening 36 which exposes a portion 32'a of Schottky contact 32' (FIG. 2D). A light transmissive conductive layer 38, such as indium tin oxide (ITO), is deposited on passivation layer 34 and on Schottky contact portion 32'a through contact opening 36; conductive layer 38 is for making electrical connections between Schottky photodiode 22' and other photodiodes or devices (not shown). Conductive layer 38 preferably has a thickness of about 600 angstroms but should be thick enough to provide adequate step coverage. Contact opening 36 and exposed contact portion 32'a may be small relative to the entire top surface of Schottky contact 32' to avoid misalignment between conductive layer 38 and photodiode island 22'. While conductive layer 38 may electrically contact Schottky contact 32' in a relatively small area indicated by dimension "Z" in FIG. 2E, the large area of contact between Schottky contact 32' and i-Si layer top surface 30' (active area Y) is effective to overcome the disadvantages of the prior art method illustrated in FIGS. 1A-1E. Moreover, those persons skilled in the art will readily recognize that the present invention will permit high packing densities without any substantial reduction of the photodiode active area.

In operation, light energy or similar electromagnetic energy incident upon photodiode 22' will cause current to flow between conductive layer 38 and base electrode 10'. The electrical signal produced will be a function of the magnitude of the electromagnetic energy incident upon the photodiode. Typically, a plurality of Schottky photodiodes are formed in an array on the substrate; the totality of different signals, created by electromagnetic energy incident upon all of the photodiodes, are processed to generate an image. The signals may be processed to create an image displayable on a cathode ray tube (CRT) or the like, or the information may be transferred to a mass storage device (such as a magnetic tape and the like) for later analysis.

It will be readily understood by those skilled in the art that the present invention is not limited to the specific embodiments described and illustrated herein. Different embodiments and adaptations besides those shown herein and described, as well as many variations, modifications, and equivalent arrangements will now be apparent or will be reasonably suggested by the foregoing specification an drawings, without departing from the substance or scope of the invention. While the present invention was described with semiconductor material having a particular type of conductivity, opposite conductivities could be used as well. Accordingly, it is intended that the invention be limited only by the spirit and scope of the claims appended hereto.

What is claimed is:

1. A Schottky photodiode, comprising:
   a substrate having a principal substrate surface;
   a first layer of metallization disposed on said principal substrate surface to form a base electrode;
   a first layer of semiconductor material having a selected conductivity disposed on said base electrode;
   at least a second layer of semiconductor material disposed on said first layer;
   a layer of conductive material disposed on said second semiconductor layer to form an active area extending substantially completely across a top surface of said second semiconductor layer, said conductive layer material forming a silicide with said second semiconductor layer at an interface therebetween; and
   another electrode in contact with said conductive layer to provide electrical connection to said photodiode.

2. A Schottky photodiode, comprising:
   a substrate having a principal substrate surface;
   a first layer of conductive material disposed on said principal substrate surface to form a base electrode;
   a first layer of semiconductor material having a selected conductivity disposed on said base electrode;
   at least a second layer of semiconductor material disposed on said first layer;

a second layer of conductive material disposed on said second semiconductor layer to form an active area extending substantially completely across a top surface of said second semiconductor layer, said second conductive layer material forming a silicide with said second semiconductor layer at an interface therebetween;

another electrode in contact with said second conductive layer to provide electrical connection to said photodiode;

at least one layer of light transmissive passivation material disposed over said photodiode and patterned to form a contact opening exposing a portion of said second conductive layer; and a light transmissive conductor disposed in electrical contact with said exposed portion of said second conductive layer to form said another electrode.

3. The Schottky photodiode of claim 2, wherein said light transmissive conductor is odium tin oxide.

4. The Schottky photodiode of claim 3, wherein said second semiconductor layer is intrinsic silicon; and said passivation material is a layer of silicon nitride formed directly upon said second conductive layer.

5. The Schottky photodiode of claim 1, wherein said metallization is selected from the group consisting of molybdenum, chromium, titanium, tungsten, aluminum and alloys thereof.

6. The Schottky photodiode of claim 1, wherein said first semiconductor layer material is N+ silicon.

7. The Schottky photodiode of claim 1, wherein said second semiconductor layer material is intrinsic silicon.

8. The Schottky photodiode of claim 7, further comprising a layer of light-transmissive passivation material fabricated directly on the intrinsic silicon layer.

* * * * *